(12) United States Patent
Kenney, Jr. et al.

(10) Patent No.: US 7,778,376 B2
(45) Date of Patent: Aug. 17, 2010

(54) STATIC PHASE ADJUST USING LC TANKS WITH OFFSET CENTER FREQUENCIES

(75) Inventors: John G. Kenney, Jr., West Windsor, NJ (US); Viswabharath P. Reddy, Edison, NJ (US)

(73) Assignee: Analog Devices, Inc., Norwood, MA (US)

( * ) Notice: Subject to any disclaimer, the term of this patent is extended or adjusted under 35 U.S.C. 154(b) by 930 days.

(21) Appl. No.: 11/565,028

(22) Filed: Nov. 30, 2006

(65) Prior Publication Data

US 2008/0129343 A1 Jun. 5, 2008

(51) Int. Cl.
*H03D 3/24* (2006.01)
(52) U.S. Cl. .................... 375/375; 375/327; 375/376; 327/156; 455/260
(58) Field of Classification Search .......... 375/375, 375/376, 327; 327/156; 455/260
See application file for complete search history.

(56) References Cited

U.S. PATENT DOCUMENTS

| | | | |
|---|---|---|---|
| 6,041,090 A * | 3/2000 | Chen | 375/376 |
| 7,016,447 B1 * | 3/2006 | Reuveni | 375/371 |
| 7,126,403 B2 | 10/2006 | Kenney, Jr. et al. | |
| 2006/0091969 A1 * | 5/2006 | Kenney et al. | 331/167 |

OTHER PUBLICATIONS

Ellermeyer et al., "10-Gb/s Eye-Opening Monitor IC Decision-Guided Adaptation of the Frequency Response of an Optical Receiver" IEEE Journal of Solid-State Circuits, vol. 35, No. 12, Dec. 2000, pp. 1958-1963.
Behbahani et al., "A 2.4 GHz Low-IF Receiver for Wideband WLAN in 0.6 nm CMOS-Architecture and Front-End" IEEE Journal of Solid-Sate Circuits, vol. 35, No. 12, Dec. 2000, pp. 1908-1916.
Hauenschild et al., "A Plastic 10 Gb/s BiCMOS Clock and Data Recovering 1:4-Demultiplexer with External VCO" IEEE Journal of Solid-Sate Circuits,vol. 31, No. 12, Dec. 1996, pp. 2056-2059.
Rofougaran et al., "SP 24.6: A 900MHz CMOS LC-Oscillator with Quadrature Outputs" 1996 IEEE International Solid State Circuits Conference, Analog Techniques Paper SP 24.6 pp. 392-393.

* cited by examiner

*Primary Examiner*—Ted M Wang
(74) *Attorney, Agent, or Firm*—Goodwin Procter LLP (57) ABSTRACT

A phase detector includes a first clock driver comprising a first LC tank. The first clock driver provides a strobe to a plurality of flip-flops associated with sampled data being received by the phase detector. The second clock driver includes a second LC tank. The second clock driver provides a strobe to a plurality of flip-flops associated with sampling the phase error of the phase detector. The first and second LC tanks have different adjustable center frequencies and experience a programmable delay between the outputs of the first and second clock drivers so as to determine the data sampling phase of the phase detector.

12 Claims, 14 Drawing Sheets

Fig. 10 Magnitude and Tail Current response of LC Tank Vs Capsel code

Fig. 9 Simulation showing power consumption vs. programmable capacitance which is determined by the codeword CAPSEL.

| spa[2] | spa[1] | spa[0] | IncrD | IncrE | ΔPhase |
|---|---|---|---|---|---|
| 0 | X | X | 0 | 0 | |
| 1 | 0 | 0 | +1 | 0 | |
| 1 | 0 | 1 | +1 | -1 | |
| 1 | 1 | 0 | 0 | +1 | |
| 1 | 1 | 1 | -1 | +1 | |

STATIC PHASE ADJUST USING LC TANKS WITH OFFSET CENTER FREQUENCIES

BACKGROUND OF THE INVENTION

The invention relates to the field of clock and data recovery circuits, and in particular, to a circuit that can be used to program the phase of the recovered clock relative to the phase of the received data using two LC resonant tanks as clock drivers, where the two LC tanks have individually adjustable center frequencies.

Many phase-locked loop (PLL) arrangements sample and retime using a recovered clock (RCLK). When the PLL is in its locked state, the falling edges of RCLK are aligned to the zero crossings in the input data. A flip-flop at the input of the phase detector samples the input on the rising edge of the RCLK to balance the setup and hold times. The quantization in this case occurs in both time and amplitude. Equal setup and hold times should provide maximum immunity to bit errors when there is jitter on the transitions of input data.

Data recovery circuits in fiber optic communication channels have benefited from the ability to move the significant instance in time within a data eye. Prior art configurations incorporating a static phase adjust feature employ an auxiliary flip-flop with a phase shifted clock relative to the clock at the phase detector. This implementation of a static phase adjust feature uses additional power for an auxiliary channel. Furthermore, bit errors made by the phase detector due to the suboptimal sampling phase can lead to incorrect phase adjustments that would increase the jitter on RCLK.

SUMMARY OF THE INVENTION

According to one aspect of the invention, there is provided a phase detector. The phase detector includes a first clock driver comprising a first LC tank. The first clock driver provides a strobe to a plurality of flip-flops associated with sampled data being received by the phase detector. The second clock driver includes a second LC tank. The second clock driver provides a strobe to the plurality of flip-flops associated with sampling the phase error of the phase detector. The first and second LC tanks have different adjustable center frequencies and experience a programmable delay between the outputs of the first and second clock drivers so as to determine the data sampling phase of the phase detector.

According to one aspect of the invention, there is provided a method of performing the operations of a phase detector. The method includes providing a first clock driver comprising a first LC tank. The first clock driver provides a strobe to a plurality of flip-flops associated with sampled data being received by the phase detector. Also, the method includes providing a second clock driver comprising a second LC tank. The second clock driver provides a strobe to the plurality of flip-flops associated with sampling the phase error of the phase detector. The first and second LC tanks have separately adjustable center frequencies. Furthermore, the method includes a programmable delay between the outputs of the first and second clock drivers so as to set the data sampling phase of the phase detector.

DETAILED DESCRIPTION OF THE INVENTION

The present invention provides for a binary phase detector having static phase adjust. The static phase adjust function is implemented by using two clock drivers in the binary phase detector to drive the flip-flops that sample data and edge bits. Two clock drivers realized as LC tanks with individually adjustable center frequencies implement a programmable delay.

Figure 1:
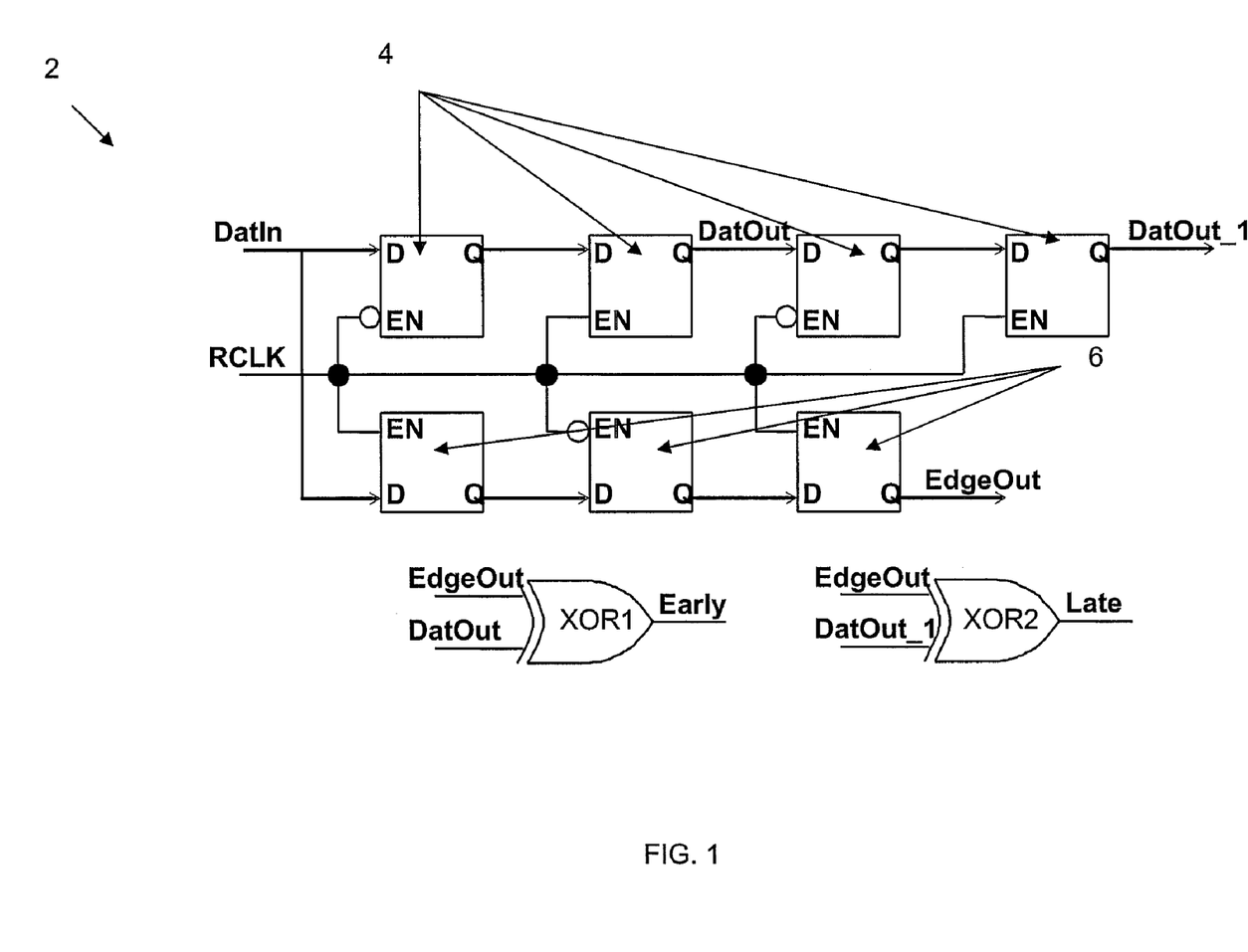
FIG. 1 is a schematic diagram of a phase detector.

FIG. 1 shows a full-rate binary phase detector 2. The binary phase detector 2 has two rows of latches 4, 6. The top row of latches 4 strobes DatIn on the rising edge of RCLK, leading to the signals denoted as DatOut, and its delayed version DatOut_1. The second row of latches 6 strobes DatIn on the falling edge of RCLK, leading to the signal denoted as EdgeOut.

Two XOR gates (XOR1, XOR2) within the binary phase detector compute phase errors. The XOR1 applies signals Edgeout and DatOut to produce output signal Early to quantize the phase difference between signals DatIn and RCLK. The XOR2 applies signals Edgeout and DatOut_1 to produce output signal (Late) to quantize the phase difference between signals DatIn and RCLK.

Figure 2:
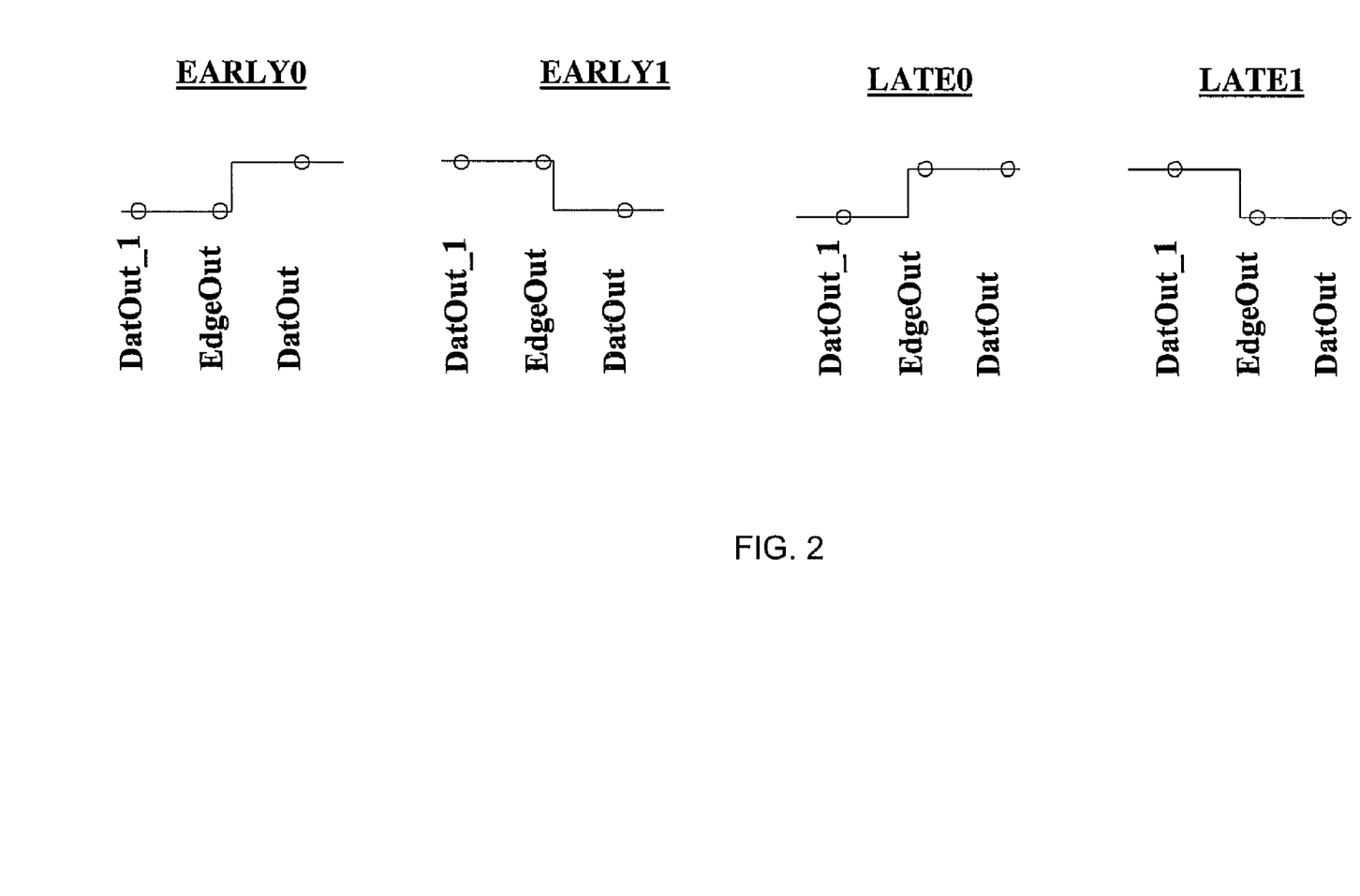
FIG. 2 is a graph demonstrating timing that determines the logic in the phase detector.

FIG. 2 shows the timing used to develop this logic. The sampling clock is early for the 2 cases where EdgeOut is not equal to DatOut (EARLY0 & EARLY1). Feedback within the PLL should push subsequent clock edges from the VCO further out in time. The sampling clock is late for the 2 cases where EdgeOut is not equal to DatOut_1 (LATE0 & LATE1). Feedback within the PLL should pull subsequent clock edges from the VCO closer in time.

The PLL in this embodiment of the invention drives the falling edges of RCLK so that they coincide with the edges of the data eye. Other embodiments may use rising edge with no compromise in performance. Early-late information, which drives the PLL, is contained within the edge bits (EdgeOut). The way to achieve static phase adjust is to move the sampling strobe for the data bits relative to the sampling strobe for the edge bits.

Figure 3:
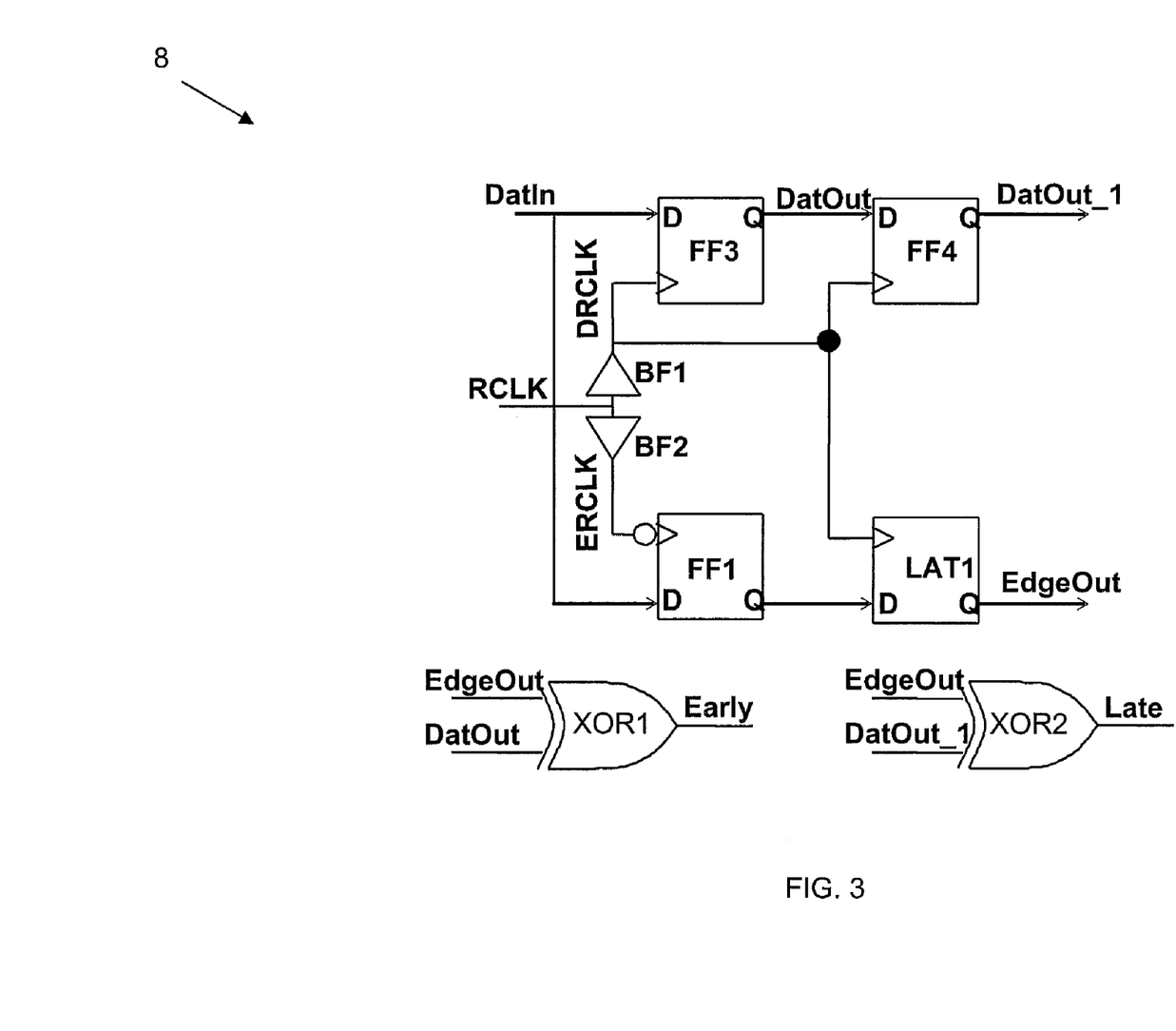
FIG. 3 is a schematic diagram of a binary phase detector with 2 clock drivers.

In FIG. 3, RCLK is applied to a pair of clock buffers denoted as BF1 and BF2. The output of BF1, which is the data read clock (DRCLK), is applied to the data sampling flip-flops, FF3, and FF4. The flip-flop receives an input signal (DatIn). The output signal (DatOut) of the flip-flop (FF3) is applied to the flip-flop (FF4), which produces the output signal (DatOut_1).

The output of BF2, which is the edge read clock (ERCLK), is applied to the edge sampling flip-flop (FF1) and a latch (LAT1). The output of the flip-flop (FF1) is applied to the latch (LAT1), which produces an output signal (Edgeout). Two XOR gates (XOR1, XOR2) within the binary phase detector compute phase errors. The XOR1 receives signals Edgeout and DatOut to produce output signal (Early) as one of the quantized values representing the phase difference between signals DatIn and RCLK. The XOR2 receives signals Edgeout and DatOut_1 to produce output signal (Late) as another of the quantized values representing the phase difference between signals DatIn and RCLK.

Figure 4:
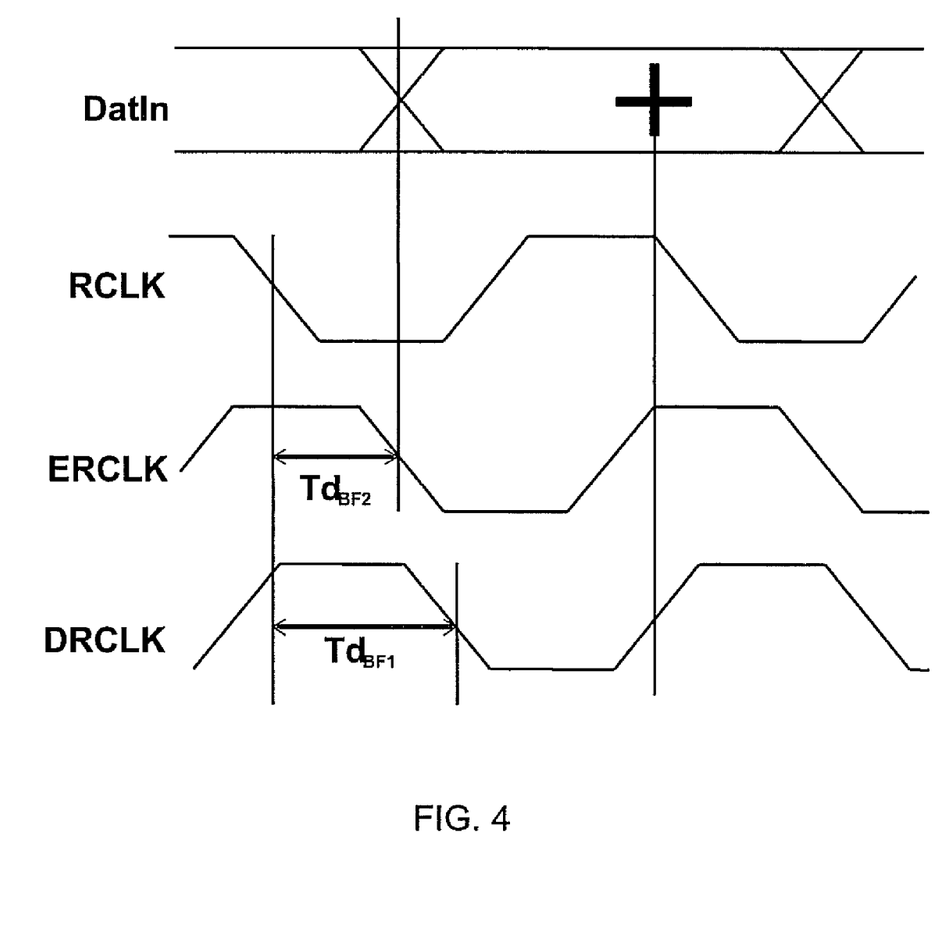
FIG. 4 is a graph demonstrating timing at the input of the binary phase detector.

Feedback in the CDR aligns the falling edge of ERCLK with the transitions in DatIn as shown in FIG. 4. By manipulating the delay through BF1 ($Td_{BF1}$) relative to the delay through BF2 ($Td_{BF2}$) a phase difference between DRCLK and ERCLK is achieved.

A prior art clock driver uses a resonant LC tank circuit with automatic center frequency tuning for driving differential clock loads that are primarily capacitive. The LC tank circuit as a clock driver has significant power advantages over a resistively loaded clock driver when the load is capacitive. The optimal center frequency is decided as the one that gives the lowest power consumption.

Figure 5:
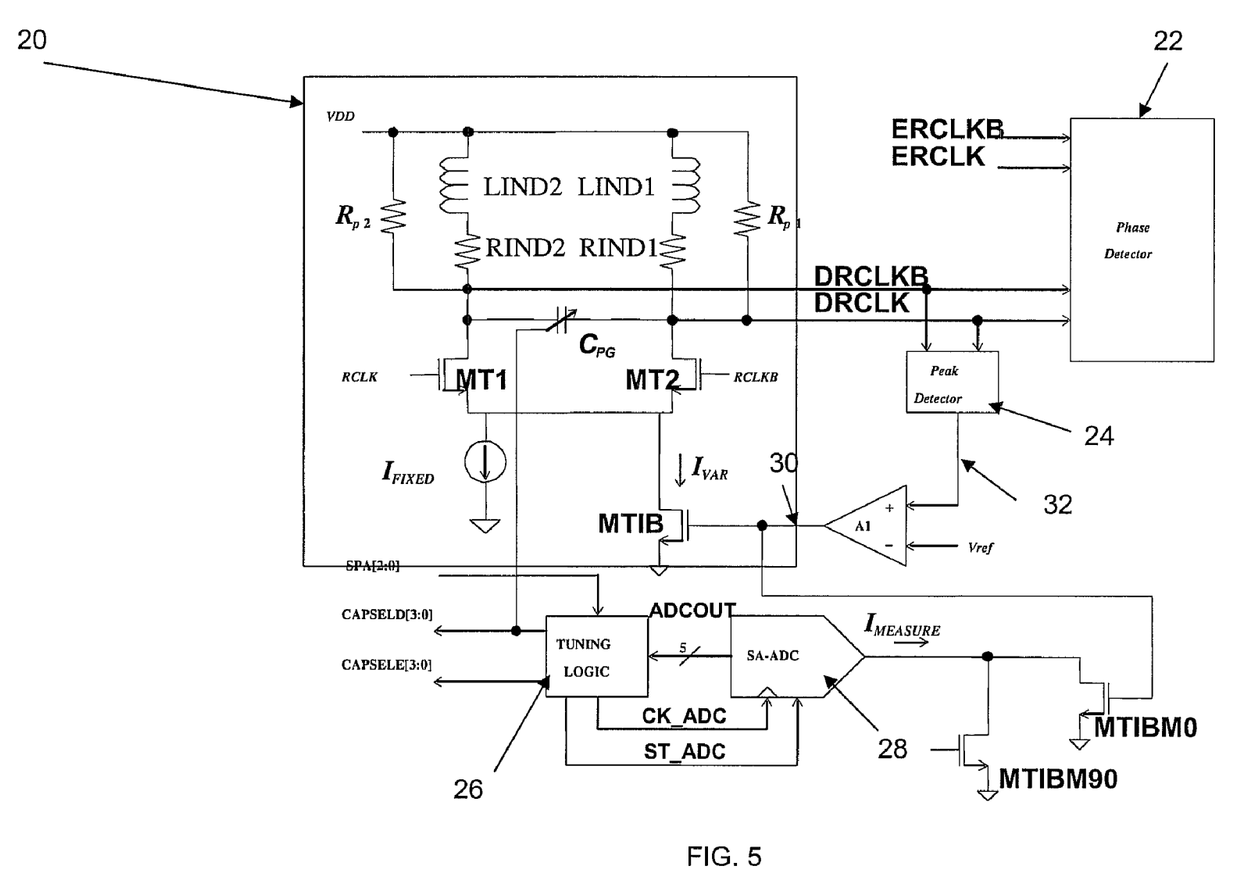
FIG. 5 is a schematic diagram of a tuned buffer system with provisions for static phase adjusts.

FIG. 5 shows the resonant tank circuit 20 that has RCLK and RCLKB as its input and DRCLK and DRCLKB as its output. An identical resonant tank circuit for which the details are not shown also has RCLK as its input but has ERCLK as its output. The LC tank includes resistors Rp1, Rp2, RIND2, RIND1 and inductors LIND1 and LIND1. Resistor Rp1 is coupled to voltage VDD and output signal DRCLK; resistor Rp2 is coupled to voltage VDD and the output signal DRCLKB. The inductor LIND1 and RIND1 are connected in series where LIND1 is coupled to the voltage VDD and RIND1 is coupled to DRCLK. RIND1 and RIND2 model the resistance of the metal in the inductors that degrade the Q of LIND1 and LIND2 respectively. The inductor LIND2 and RIND2 are connected in series where LIND2 is coupled to the voltage VDD and RIND2 is coupled to DRCLKB.

Resistors Rp1 and Rp2 are placed in parallel with the inductors in the LC tank to dampen the resonance of the tank. These resistors stabilize the Q of the tank over process at the expense of slightly higher power consumption. The lower Q resulting from Rp1 and Rp2 leads to a gradual change in the phase response of the LC tank as the capacitance is changed. This characteristic proves to be beneficial in implementing static phase adjust. The impedance presented by the phase detector 22 should be the same for both DRCLK and ERCLK.

The phase detector 22 receives two differential clocks ERCLK/ERCLKB, and DRCLK/DRCLKB. The input signal RCLK is coupled to the gate of the MOSFET MT1. The input signal RCLKB is coupled to the gate of the MOSFET MT2. The sources of MT1 and MT2 share a common node with a fixed current source $I_{FIXED}$ and the drain of MTIB, which provides a variable current, $I_{VAR}$. The drains of MOSFETs MT1 and MT2 are separately coupled to the differential clock lines DRCLKB and DRCLK. A 4-bit programmable MIM capacitor ($C_{PG}$), whose value is set by CAPSELD and is associated with tuning logic 26, is placed between the drains of MOSFETs MT1 and MT2.

An automatic gain control adjusts $I_{VAR}$ to achieve a fixed voltage swing at DRCLK and DRCLKB. A peak detector 24 uses as input signals DRCLK and DRCLKB. An amplifier (A1) receives the output signal 32 from the peak detector and voltage Vref. The amplifier (A1) produces an output signal, which is applied to the gate of the MOSFET MTIB. The output signal 30 is also applied to the gate of MOSFET MTIBM0. A similar output signal derived from the peak detector on signals ERCLK and ERCLKB drives the gate of MOSFET MTIBM90. The drain current of MTIBM0 and MTIBM90 are combined to form $I_{MEASURE}$, which is applied to the analog input of an A/D converter.

The tuning circuit 26 receives a digital codeword (SPA) that coordinates the activities of the tuning circuit 26. The codeword denoted as SPA can be, but is not limited to 3 bits. The input signal (SPA) is used to manipulate the relative phase responses of the LC tank 20. The tuning circuit 26 provides two output signals (CAPSELD CAPSELE). The output signal (CAPSELD) is applied to the MIM capacitor (Cpg). Also, the tuning circuit 26 provides two output signals (CK_ADC ST_ADC) to drive a successive approximation analog to digital (A/D) converter 28, although in practice, it could be any type of A/D converter. The A/D converter 28 outputs a signal (ADCOUT) to the tuning circuit 26, after quantizing a current ($I_{MEASURE}$) that is derived from the drains of the MOSFETs MTIBM90 and MTIBM0.

Figure 6:
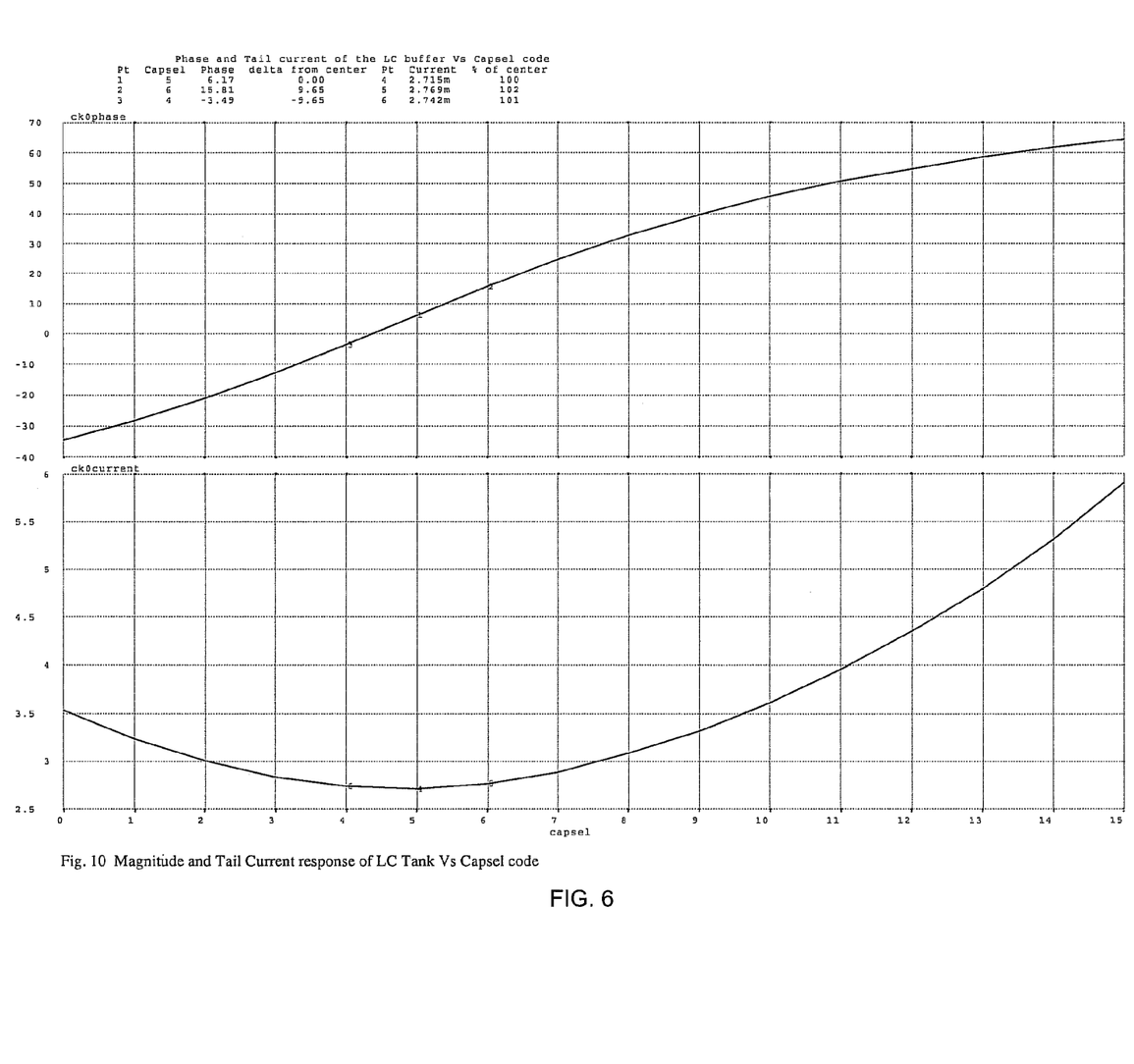
FIG. 6 is a graph demonstrating magnitude and phase response of LC tank.

The frequency at which power consumption is minimized in the LC tank 20 is also the frequency at which the phase shift is 0. The magnitude and phase response for an LC tank 20 having a quality factor of 5 (Q=5) is shown in FIG. 6. The phase response for the LC tank 20 is defined by $$\text{Phase} = -a\tan\left[\omega CR\left(1 - \frac{1}{\omega^2 LC}\right)\right] \text{rad}, \qquad \text{EQ. 1}$$

where ω is the clock frequency. The center frequency of the tank, $\omega_o$, is equal to $1/\sqrt{LC}$. For small differences between the center frequency of the tank 20 and the clock frequency, the phase response of the LC tank 20 is $$\text{Phase} = -2Q\left(\frac{\Delta\omega}{\omega_0}\right)\frac{180}{\pi} deg \qquad \text{EQ. 2}$$

where this expression is valid for $$2\left(\frac{\Delta\omega}{\omega_o}\right)Q \approx 1$$

Ideally, both clock buffers are centered so their phase responses are 0° at the frequency of RCLK. Adding or removing a small capacitance from only one of the tanks implementing the clock drivers causes a phase difference between their two outputs. This phase difference is the programmable static phase adjustment that is the object of this invention.

The MIM capacitor (Cpg) is controlled by CAPSELD for the data clock and CAPSELE for the edge clock. A bit register internal to TUNING LOGIC has an output CAPSEL, that is initialized to its lowest value at startup. No static phase adjust is desired during acquisition phase, so CAPSELD=CAPSELE=CAPSEL. The finite state machine steps through all 16 codes of CAPSEL to identify the setting that leads to the lowest power consumption.

Figure 7:
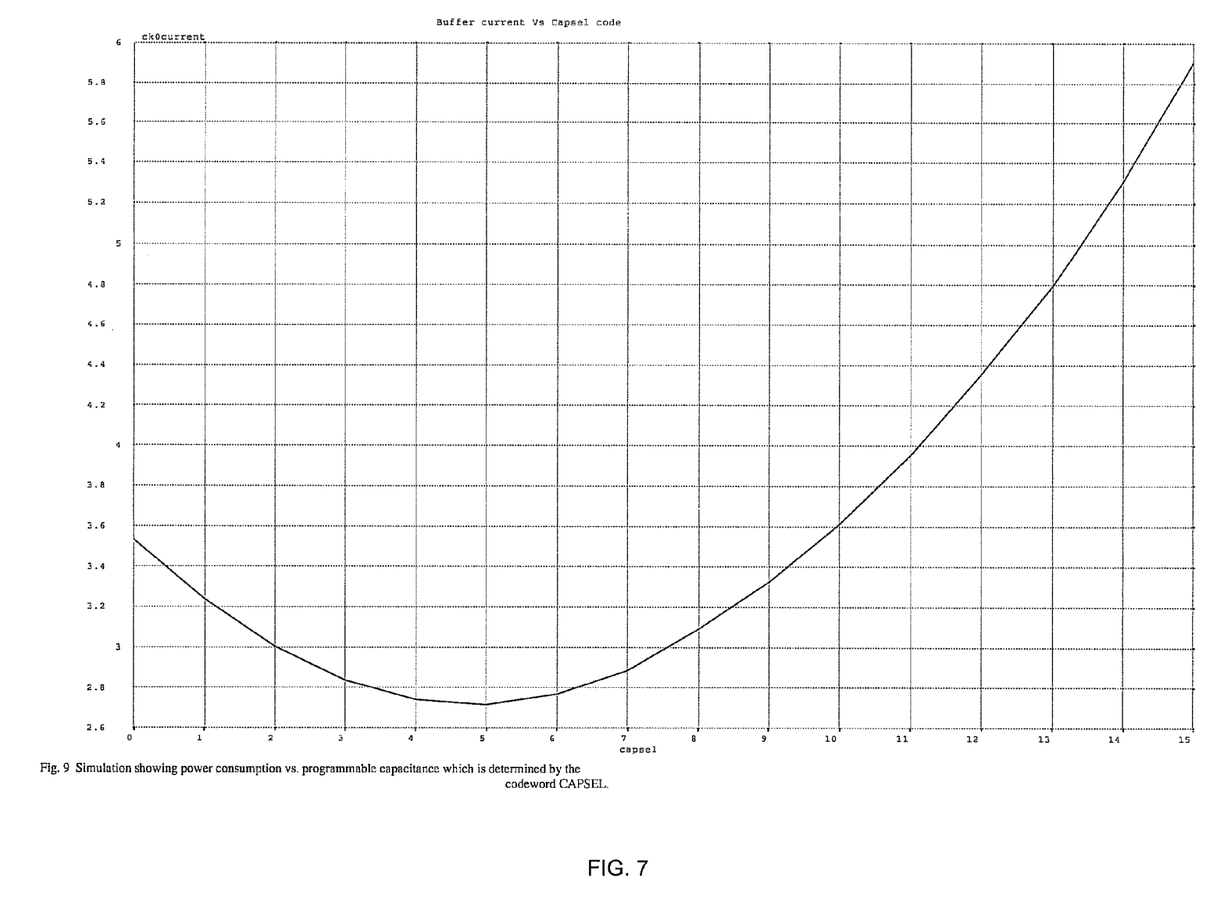
FIG. 7 is a graph demonstrating power consumption vs. programmable capacitance determined by a codeword CAPSEL.

Power consumption is measured using an A/D converter 28, which is shown as a successive approximation type. An automatic gain control (AGC) that includes a peak detector 24, an amplifier A1 and a MOSFET, MT1B adjusts the variable component of the tail current $I_{VAR}$ so that the single-ended output swing is 400 mV. A scaled replica of $I_{VAR}$ in the buffer for DRCLK is combined with a similar replica in the buffer for ERCLK to create a new current $I_{MEASURE}$. An A/D converter 28 quantizes $I_{MEASURE}$, which is a copy of the variable current used by the clock buffers. The result of sweeping the CAPSEL codes is shown in FIG. 7, where the optimal capacitor selection is 5.

FIG. 6 shows the magnitude and phase response of an LC tank that is configured as a clock buffer for the 16 program values. An offset by 1 least-significant bit (LSB) code in CAPSEL for this specific realization of an LC tank at 5 GHz modifies the phase by θ=9.65 degrees, while an offset by 2 LSBs modifies the phase by 19.3=2*9.65 degrees. The value of θ can be approximated using the parameters of the tank as (Q·ΔC/C)·180/π degrees where ΔC is the size of a unit capacitor in Cpg and C is the size of the capacitor when the center frequency is matched to the clock frequency.

The resolution in phase steps is limited by the minimum capacitor size that can be switched in or out of the tank. In this embodiment, CAPSELD and CAPSELE deviate only one position from their ideal value. The full-scale range of static phase adjustments may be extended by more positions if the tank is centered in such a way that the value of CAPSEL leading to minimum power consumption is in the middle of its code range (e.g., 8).

This particular invention depends upon the Q of the tank being stable over process and temperature. Inductors in CMOS processes are implemented using metal, which has a temperature coefficient on the order of 3200 PPM/° C. A 1 nH inductor with a Q of 5 at 25° C. will have a Q of 5.43 at 0° C. and a Q of 3.79 at 125° C. The resulting change in phase for a 1 LSB step in codeword (of 4-bits for the capacitive load) would be 53.7 mUI at 0° C. and 39.5 mUI at 125° C., where UI denotes unit interval or bit period. This temperature dependency would make this approach unreliable in the applications for which it is intended.

This sensitivity to temperature can be reduced by placing a resistor with a low temperature coefficient in parallel with a high-quality factor inductor (Q=10). Mixed-signal CMOS processes generally provide an unsilicided polysilicon resistor, which has a temperature coefficient an order of magnitude less than that of metal. For an inductor of Q=10 at 5 GHz and a parallel resistor with a resulting Q=5, the resulting variation in Q from minimum temperature to maximum temperature is 5.24:4.33. This is about a 20% variation in Q as compared to a 45% variation in Q if the polysilicon resistors are left out.

Figure 8:
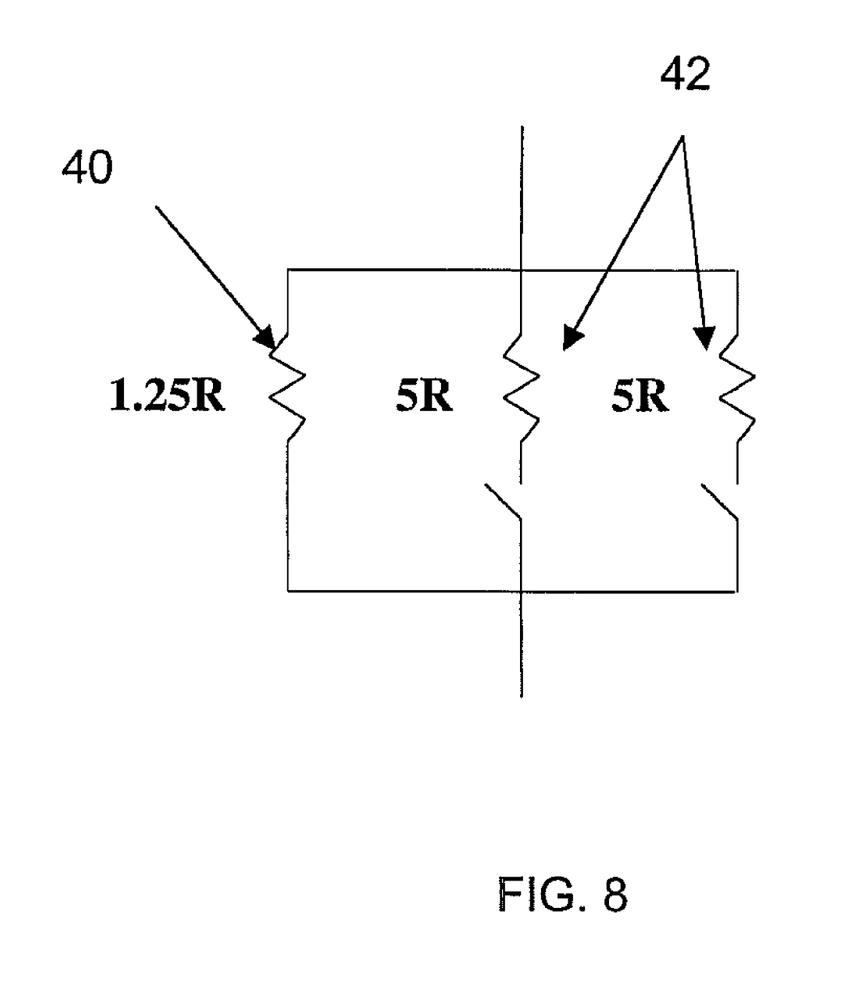
FIG. 8 is a schematic diagram illustrating at trim resistor implementing in LC tanks.

Polysilicon resistors may vary by as much as ±20% over processing. These variations can be mitigated in a process with metal fuses, by having a main resistor 40 that is 1.X (1.25) times the desired resistance in parallel with a number of smaller resistors 42 as shown in FIG. 8. The resistors 40, 42 are shown as unit sized, but other weightings can be use. The total parallel resistance of this circuit should be a fraction of the desired resistance, which for this example is 0.8. Sheet rho of polysilicon resistors tends to be constant on a die. Therefore, a polysilicon test structure can be used to measure sheet rho. Unit sized resistors can be removed (using metal fuses) from the tank to achieve the desired quality factor.

Figure 9:
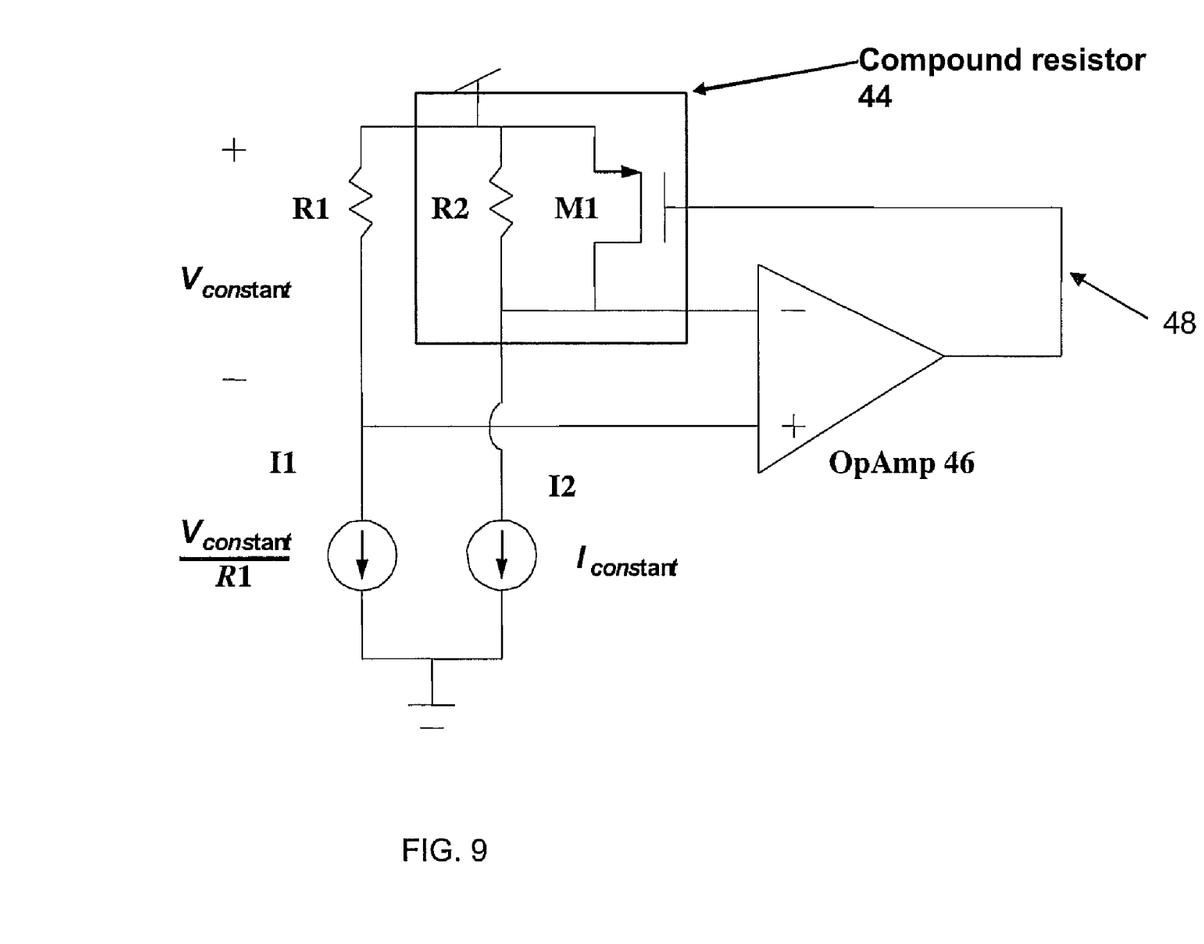
FIG. 9 is a schematic diagram illustrating a composite resistor that is fixed over process and temperature.

If the metal fuses are not an option, the effect of process variation can be mitigated by using a structure called a composite resistor 44 across the inductor. The composite resistor 44, depicted in FIG. 9, is comprised of a polysilicon resistor (R1) in parallel with a PMOS transistor (M1) in triode. In the replica bias, a composite resistor 44 receives a process independent current I2 that is of a known quantity; this current may be generated using an off-chip resistor of known quantity. The impedance of the composite resistor 44 is equal to Vconstant/I2. An Op-Amp 46 receives at its inverting input the drain voltage of the transistor (M1), while the non-inverting input receives the voltage across the resistor R1. The output signal 48 of the Op-Amp 46 drives the gate of the transistor (M1) so that the voltages at the two input terminals are approximately equal; finite gain and offsets prevent them from ever being exactly equal.

As shown in FIG. 5, the MIM capacitor ($C_{PG}$) used as a part of the LC tank load 20 can vary as much as ±20% over processing. The tuning process makes sure that the total capacitance switched into the LC tank 20 is the same, regardless of the process. Process variations in the manufacturing of MIM capacitors affect the step size of the Phase Adjust. Consequently, the ±20% variation in capacitance will result in approximately ±20% variation in the Phase Adjust step.

Moving the center frequency of the tank 20 from its optimal value leads to a slight increase in power consumption. The gain change in dB for the tank from the ideal center frequency to a center frequency that is 1 LSB step from ideal is −0.44 dB. The AGC loop provides 5.15% more current to the tank to maintain the same signal swing at the output.

Figure 10:
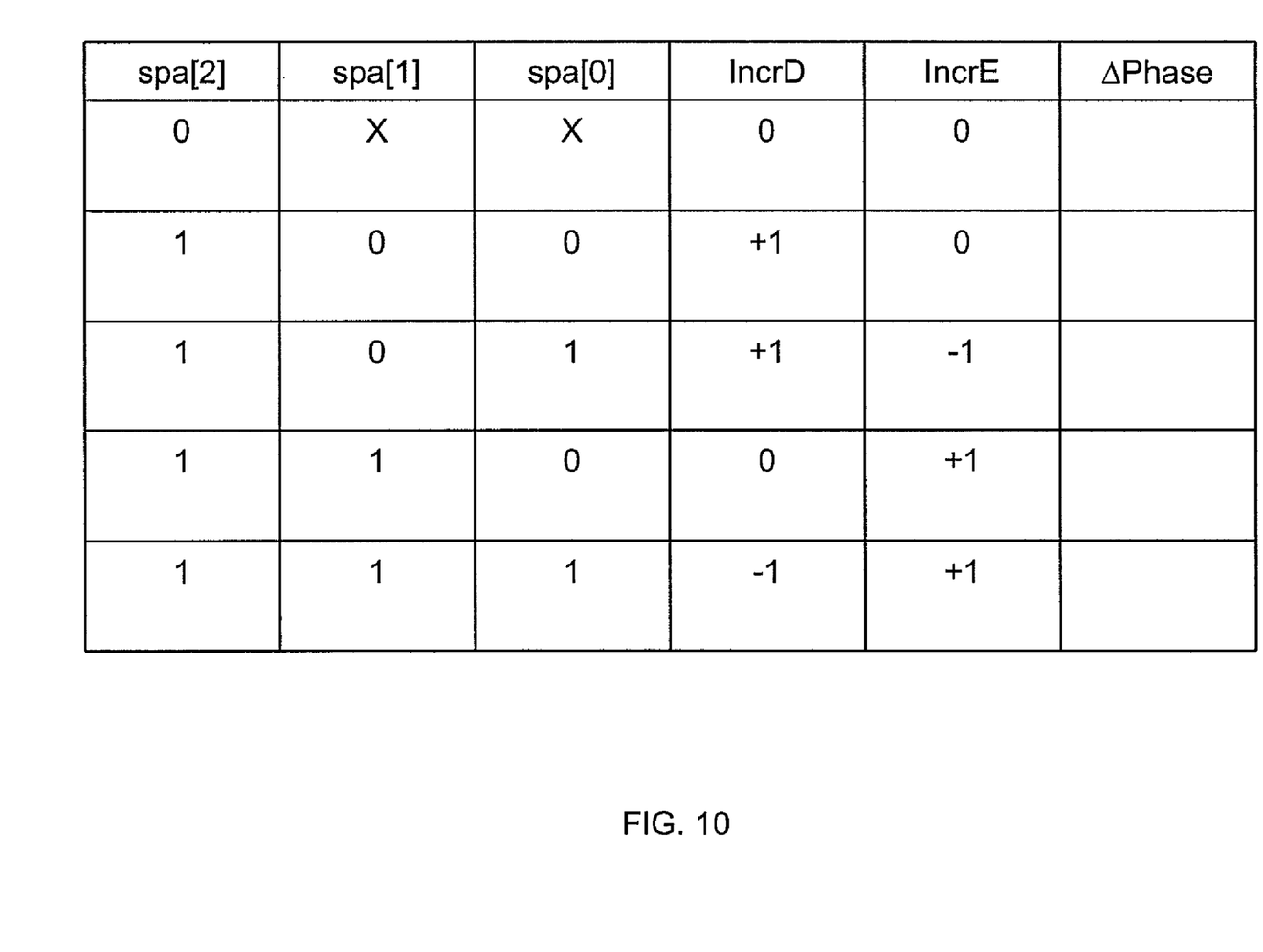
FIG. 10 is a sample truth table demonstrating the operation of the codeword CAPSELE.

The 3-bit input signal (SPA) is used to manipulate the relative phase responses of the 2 tanks. In the case where higher phase shift is required in DRCLK relative to ERCLK, an extra pair of MIM capacitors can be switched across the LC tank for DRCLK. A sample truth table is shown in FIG. 10. The static phase adjust is disabled when spa[2] is 0. Having spa[2] be HIGH, activates the static phase adjust function. The 2-lower order bits determine how capacitors are added to or removed from across the tank. The value of CAPSELD=CAPSEL+IncrD, while the value of CAPSELE=CAPSEL+IncrE, where IncrD and IncrE fall out of the truth table in FIG. 10.

XOR1 and XOR2 in FIG. 3 preferably receive DatOut, DatOut_I and Edgeout on the same clock edge. A clock domain transfer occurs in the boundary between FF1, which is on the clock domain specified as ERCLK and LAT1, which is on the clock domain specified as DRCLK. FF1 grabs data on a falling edge, while LAT1 grabs data on a rising edge. Assuming that the clocks have a 50% duty cycle, the maximum amount of programmable phase adjust when $Td_{BF2}-Td_{BF1}>0$ is a function of the clock period, the clock-to-Q delay of FF1, and the setup time of LAT1. The maximum amount by which the sampling instance can be moved left of center in the data eye is $$Td_{BF2} - Td_{BF1} = T_{period}/2 - T_{setup}(LAT1) - T_{CKtoQ}(FF1) \qquad \text{EQ. 3}$$

There is more range in phase adjustment for $Td_{BF1}-Td_{BF2}>0$. In this case, the clock-to-Q delay increases the level of phase adjust that can be achieved. The maximum amount by which the sampling instance can be moved to right of center in the data eye is $$Td_{BF1} - Td_{BF2} = T_{period}/2 - T_{hold}(LAT1) - T_{CKtoQ}(FF1). \qquad \text{EQ. 4}$$

Figure 11:
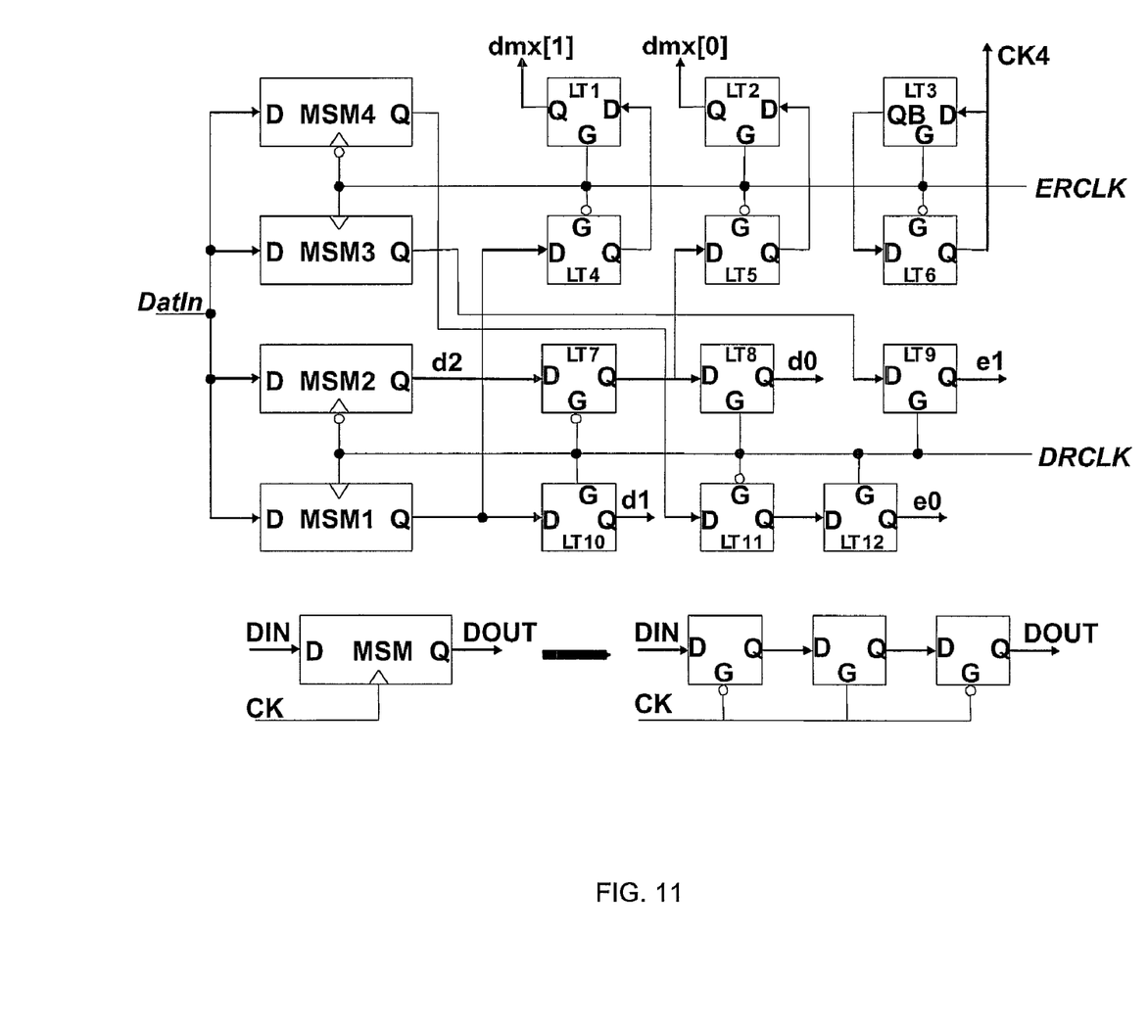
FIG. 11 is a schematic block diagram illustrating a half rate binary phase detector.

Another embodiment of the invention is in a half rate binary phase detector. Half rate phase detectors are frequently used when a particular process technology does not support a full rate phase detector. Another justification for using a half rate phase detector is that it can consume less power than a full rate phase detector although it physically requires more latches. An example of a phase detector is shown in FIG. 11. The half rate phase detector includes flip-flops (MSM1-MSM4) and a series of latches LT1-LT12.

The key I/O of this half rate phase detector is a full-rate data input DatIn, a 1:2 deserializer with the output data dmx[1:0] formed by latches LT1 and LT2, a divider implemented as LT3 and LT4 to give a ¼ baud rate clock for further deserialization, a data bit clock denoted as DRCLK, an edge bit clock denoted as ERCLK, data bits {d2,d1,d0}, and edge bits {e1,e0} that can be logically combined to give phase updates.

In contrast to a full rate phase detector, the half rate phase detector samples on both clock edges of DRCLK and ERCLK.

Figure 12:
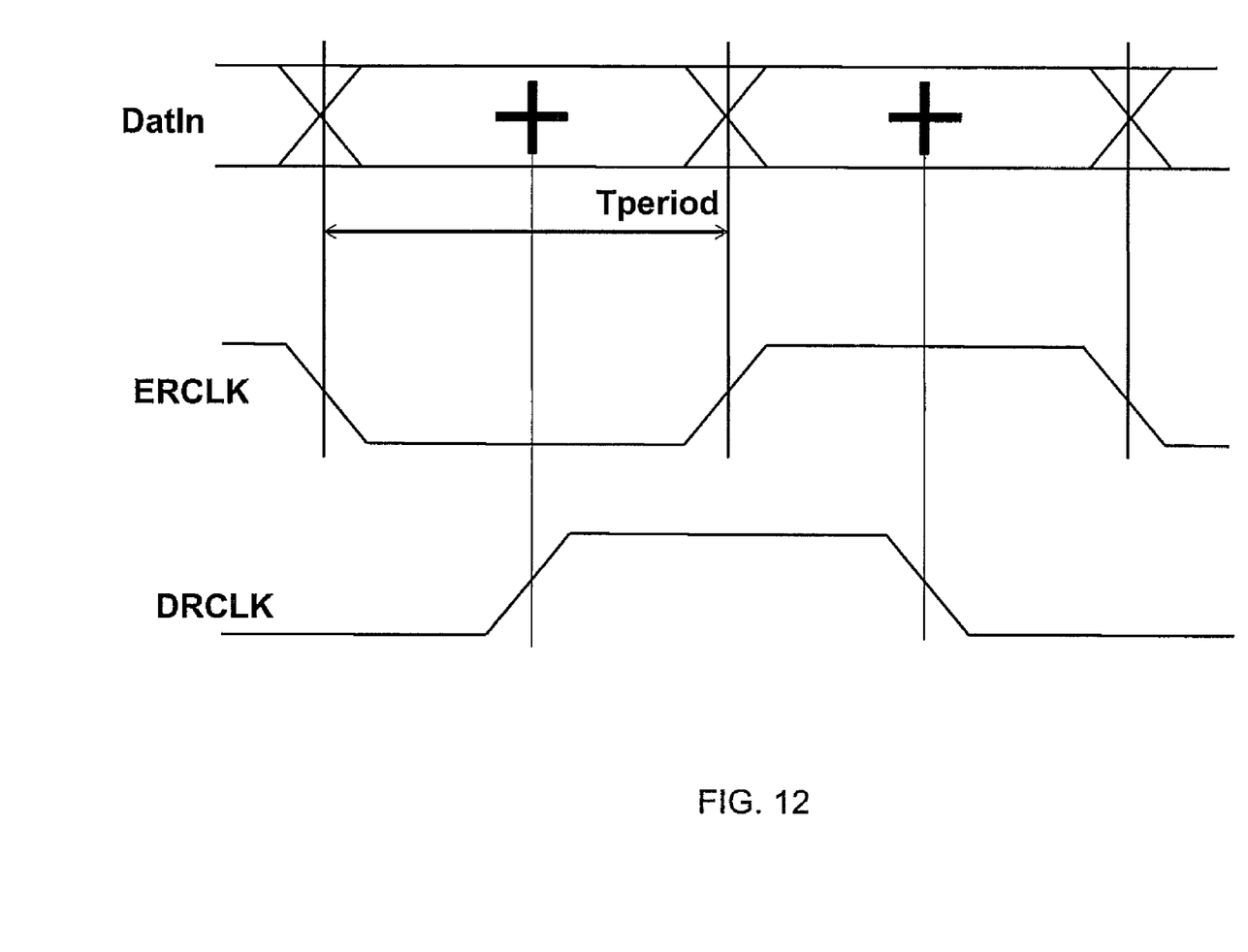
FIG. 12 is a graph demonstrating timing in the half rate binary phase detector.

A half rate phase detector has 2 clocks DRCLK and ERCLK, preferably with a 50% duty cycle, at a frequency that is half of the data rate. These two clocks DRCLK and ERCLK have a quadrature relationship; the timing for these quadrature clocks as well as their relationship to the data when the PLL is locked is shown in FIG. 12. The data-sampling clock is DRCLK, and the edge-sampling clock is ERCLK. The PLL drives the edges of ERCLK so they are aligned with the edges of DatIn.

Figure 13:
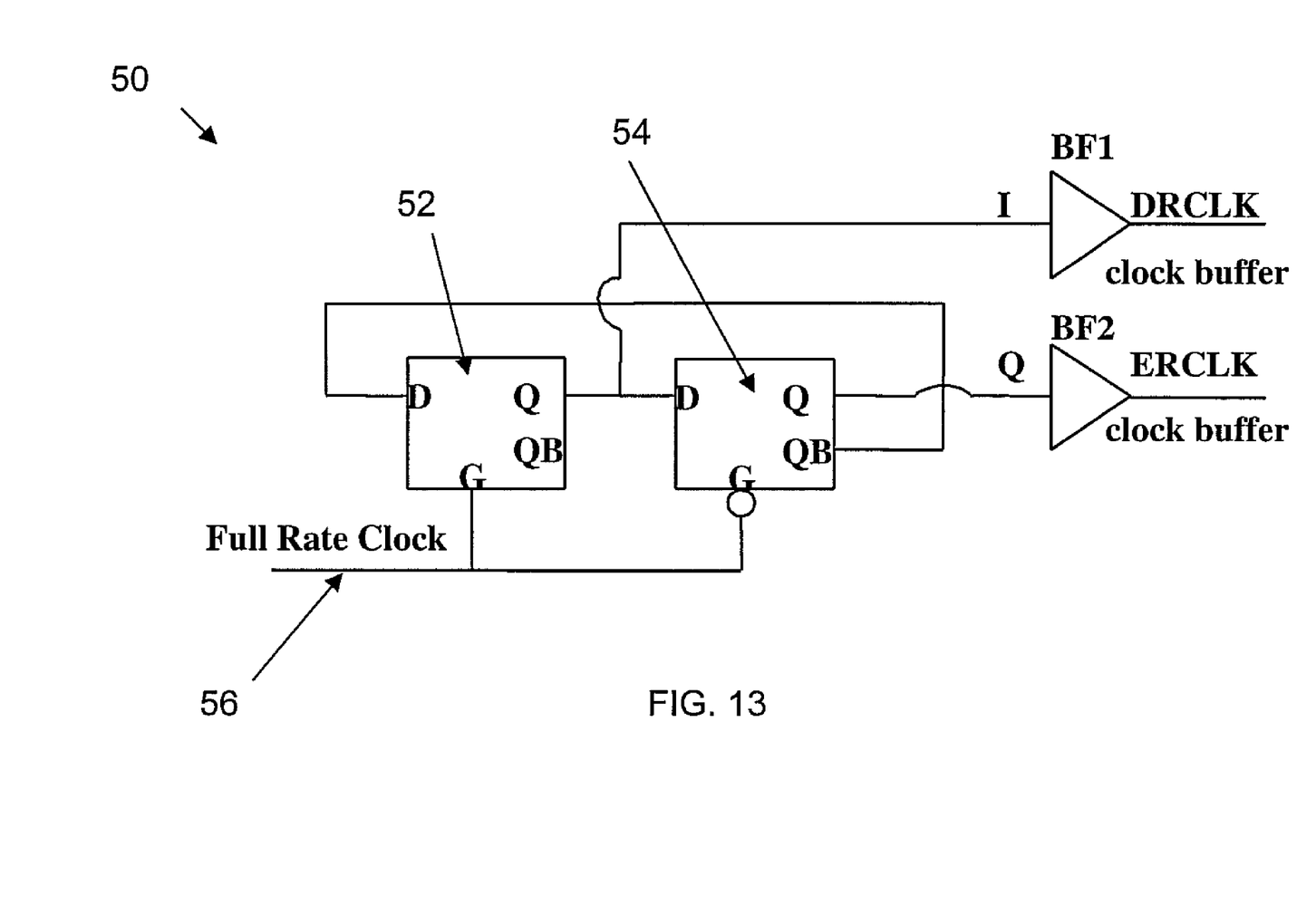
FIG. 13 is a schematic block diagram of a quadrature clocks used in accordance with the invention.

FIG. 13 shows a circuit for generating quadrature half-rate clocks from a full rate clock. A full rate clock drives the enable inputs on a toggle flip-flop. Other techniques for creating quadrature clocks include polyphase filters and quadrature VCOs. The toggle flip-flop is implemented as 2 latches where the Q output of the first latch 52 is connected to the D input of the second latch 54 and the QB output of the second latch 54 is connected to the D input of the first latch 52. A positive clock on the G input of the first latch 52 makes it transparent, while a negative clock on the G input of the second latch 54 makes it transparent. A negative clock on the G input of the first latch 52 places it in hold mode, while a positive clock on the G input of the second latch 54 places it in hold mode. The Q output of the first latch 52 provides the in-phase clock that drives the clock buffer (BF1) for DRCLK, while the Q output of the second latch 54 provides the quadrature-phase clock that drives the clock buffer (BF2) for ERCLK.

The quadrature phase relationship between the in-phase and quadrature-phase clocks is maintained if the clock buffers (BF1, BF2) are perfectly matched. Static phase is adjusted by altering the relative delay through the clock buffers (BF1, BF2). When these clock buffers (BF1, BF2) are implemented as LC tanks, this delay is established by offsetting their center frequencies. This technique was previously described for the full rate implementation.

Figure 14:
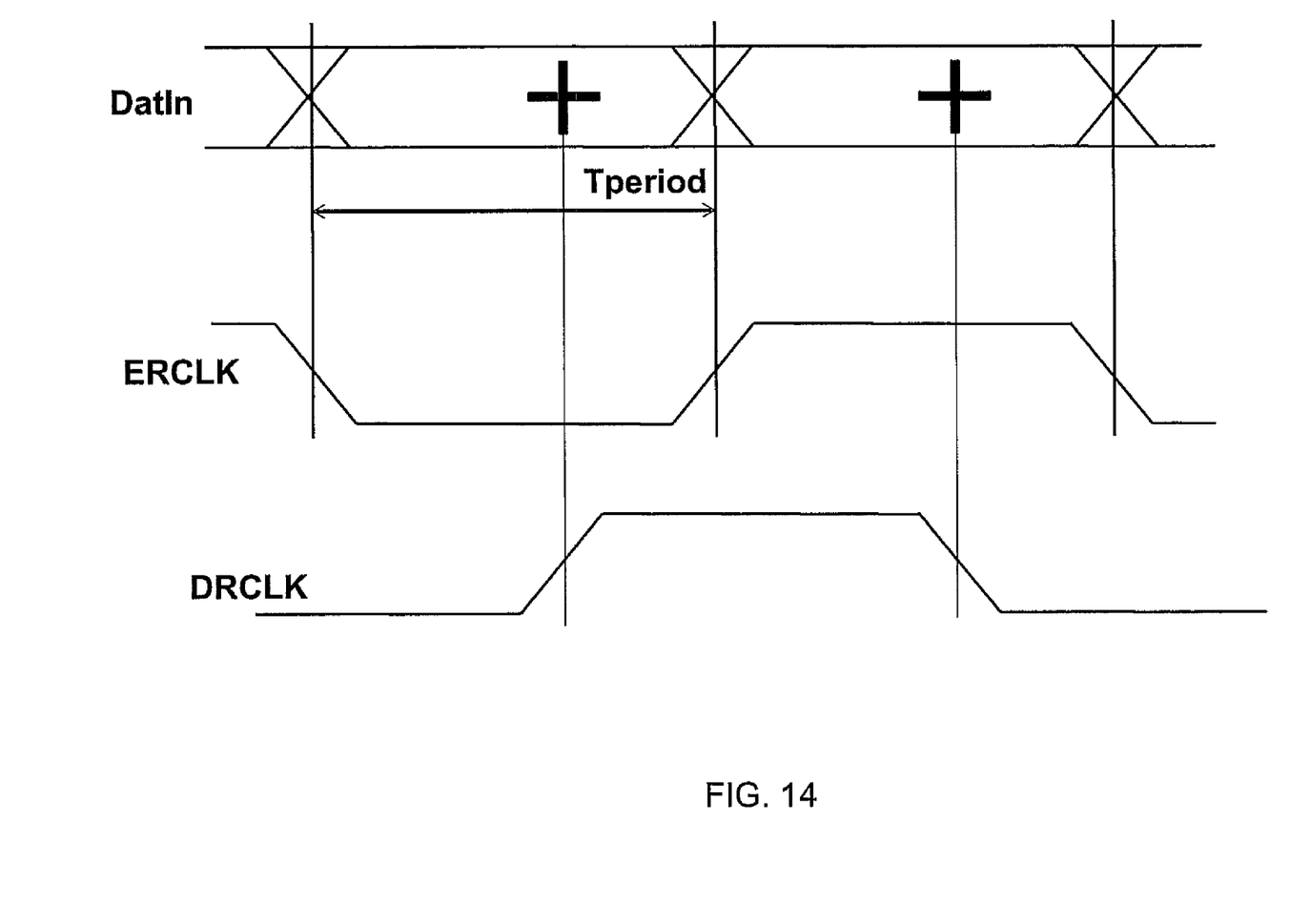
FIG. 14 is a graph demonstrating static phase adjust in a half rate binary phase detector.

FIG. 14 shows static phase adjust in a half-rate phase detector. In the example, ERCLK is aligned to the edges of data eye. The rising and falling edges of DRCLK, which sample the centers of the data eye move together. In this example, both edges are moved toward the right side of the data eye.

The change in phase for an LC tank has a different meaning for a half-rate phase detector than a full rate phase detector. The relationship between unit intervals (UI) and degrees at full rate is 1UI=360°. The relationship between unit intervals (UI) and degrees at half rate is 1UI=180°.

One of the factors limiting the amount of programmable static phase is satisfying the setup and hold times on latches that grab data across the clock domains. There are four clock domain transfers in the half rate phase detector. The two clock domain transfers from DRCLK to ERCLK occur from the Q output of MSM1 to the D input of LT4, and from the Q output of LT7 to the D input of LT5. The two clock domain transfers from ERCLK to DRCLK occur from the Q output of MSM4 to the D input of LT11 and from the Q output of MSM3 to the D input of LT9.

A 90° phase shift exists between DRCLK and ERCLK. Reducing this phase shift toward 0° impinges on the hold times of LT9 and LT11; the hold time for LT9 and LT11 are identical. Generally, the hold times in CML latches are negative, for example, the data on the D input can change before the signal on the enable pin G switches the latch from transparent to hold mode. Up to 0.5UI of phase static phase adjust is likely attainable, when the objective is to move the quantization in time closer to the left edge of the data eye.

A reduction in the phase shift between DRCLK and ERCLK also cuts into the setup times on LT4 and LT5, which are also equal. The amount of phase shift time with respect to setup time on LT4 is $$Td_{BF2} - Td_{BF1} < 3T_{period}/2 - T_{setup}(LAT4) - T_{CLKtoQ}(MSM1). \quad \text{EQ. 5}$$

A result of using a half-rate rather than a full-rate phase detector is that a full clock period has been added to the setup time for this clock domain transfer.

Increasing the phase shift between DRCLK and ERCLK results in the setup and hold time constraints being inverted for the critical latches. Hold time constraints now apply to LT4 and LT5, while setup time constraints apply to LT9 and LT11.

One new issue that needs to be considered is the D-to-Q delay of LT9. The logic signal e1 can be XORed with d2 or d1 to provide early-late updates. The main problem is that the output of LT9 is used while the G input is HIGH. Thus, if the D input of LT9 is changing while the G input is active, the output will also change. Variations in e1, when the signal is supposed to be constant, may impact the early late updates. This problem can be overcome by adding additional latches on the outputs of LT9 and LT10. The outputs of LT7 and these two additional latches can be used for the early-late computations that occur between d1, e1 and d2. Dummy loads should be added to ERCLK to keep the clock loading balanced.

The half rate phase detector solves the following problems with the full rate approach: it has balanced loading on the data clock and edge clock (e.g., 12 latches each); a half rate phase detector has two clock buffers (BF1, BF2) so adding the static phase adjust function does not add significant complications to the design; clock domain transfers have almost a full clock period so the amount of static phase adjust is not limited by the setup and hold times of flip-flops This invention differs from prior art in that it embeds the static phase adjust in a binary phase detector. RCLK is applied to two LC tank clock drivers with different center frequencies. The first LC tank provides a strobe to the flip-flop that grabs data. The second LC tank provides a strobe to the flip-flop that samples the phase error. The phase difference between the two LC tanks, which is a function of the center frequency offset between the two resonant tanks, determines the data sampling phase.

Although the present invention has been shown and described with respect to several preferred embodiments thereof, various changes, omissions and additions to the form and detail thereof, may be made therein, without departing from the spirit and scope of the invention.

What is claimed is:

1. A phase detector comprising:
a first clock driver comprising a first LC tank, said first clock driver provides a strobe to a plurality of flip-flops associated with sampled data being received by said phase detector; and
a second clock driver comprising a second LC tank, said second clock driver provides a strobe to a plurality of flip-flops associated with sampling the phase error of said phase detector;
said first and second LC tanks having different adjustable center frequencies and experiencing a programmable delay between the outputs of the first and second clock drivers so as to determine the data sampling phase of said phase detector.

2. The phase detector of claim 1, wherein said phase detector receives two clock signals.

3. The phase detector of claim 1, wherein said first and second clock drivers comprises a digital codeword to manipulate the relative phase responses of the first and second LC tanks.

4. The phase detector of claim 2, wherein said clock signals comprise in-phase clock and a quadrature-phase clock.

5. The phase detector of claim 4, wherein said phase detector comprises a half rate phase detector.

6. The phase detector of claim 5, wherein said phase detector comprises a full rate phase detector.

7. A method of performing the operations of a phase detector comprising:
providing a first clock driver comprising a first LC tank, said first clock driver provides a strobe to a plurality of flip-flops associated with sampled data being received by said phase detector; and
providing a second clock driver comprising a second LC tank, said second clock driver provides a strobe to a plurality of flip-flops associated with sampling the phase error of said phase detector;
allowing said first and second LC tanks to have different adjustable center frequencies; and
experiencing a programmable delay between the outputs of the first and second clock drivers so as to determine the data sampling phase of said phase detector.

8. The method of claim 7, wherein said phase detector receives two clock signals.

9. The method of claim 7, wherein said first and second clock drivers comprise a digital codeword to manipulate the relative phase responses of the first and second LC tanks.

10. The method of claim 9, wherein said clock signals comprise in-phase clock and a quadrature-phase clock.

11. The method of claim 8, wherein said phase detector comprises a half rate phase detector.

12. The method of claim 11, wherein said phase detector comprises a full rate phase detector.

* * * * *